United States Patent
Gattuso et al.

(10) Patent No.: US 6,965,246 B2
(45) Date of Patent: Nov. 15, 2005

(54) BURN-IN SOCKET ASSEMBLY

(75) Inventors: Andrew D Gattuso, Phoenix, AZ (US); Sung-Pei Hou, Tu-chen (TW); Hsiu-Yuan Hsu, Tu-Chen (TW); Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/826,214

(22) Filed: Apr. 16, 2004

(65) Prior Publication Data
US 2005/0231224 A1 Oct. 20, 2005

(51) Int. Cl.[7] .................. G01R 31/02; H01R 11/22
(52) U.S. Cl. ............... 324/760; 324/754; 324/758; 439/70; 439/264; 439/331
(58) Field of Search ................. 324/754–765, 324/158.1; 439/70, 264

(56) References Cited

U.S. PATENT DOCUMENTS

| | | | |
|---|---|---|---|
| 5,172,049 A | 12/1992 | Kiyokawa et al. | |
| 5,414,370 A * | 5/1995 | Hashinaga et al. | 324/760 |
| 5,432,456 A * | 7/1995 | Kelley | 324/538 |
| 5,470,247 A * | 11/1995 | Fuchigami | 439/264 |
| 5,911,897 A * | 6/1999 | Hamilton | 219/497 |
| 6,353,329 B1 * | 3/2002 | Kiffe | 324/760 |
| 6,570,398 B2 * | 5/2003 | Murphy et al. | 324/755 |
| 2002/0115315 A1 * | 8/2002 | Clayton | 439/70 |

* cited by examiner

Primary Examiner—Vinh Nguyen
Assistant Examiner—Emily Y Chan
(74) Attorney, Agent, or Firm—Wei Te Chung

(57) ABSTRACT

A burn-in socket assembly (1) includes a base (10) receiving an IC and a number of contacts, a slider member (20) mounted onto the base and capable of moving along the base, a pair of actuation members (30) assembled onto the base, and a cover (40) assembled onto the actuation members and capable of moving up and down. The base forms a pair of receiving elements (141) on front and end sides respectively. Each receiving element includes a body portion (142), a pair of spaced top portion (143) each having slits (144) extending therethrough and an aperture (145) extending therethrough. A sensor is received in the aperture to provide signals to a controller during being operated at high temperature. The controller can reliably control the temperature of the whole assembly in light of the signals from the sensor, thereby avoiding damage of the IC by exorbitant temperature.

7 Claims, 3 Drawing Sheets

BURN-IN SOCKET ASSEMBLY

BACKGROUND OF THE INVENTION

1. Field of the Invention

The present invention relates to a burn-in socket for electrically connecting an electronic package such as an integrated circuit (IC) with a circuit substrate such as a burn-in board.

2. Description of the Prior Art

Electronic packages, such as integrated circuits (ICs), are miniaturized electronic devices in which a number of active and passive circuit elements are located on or within a continuous body of material to perform the function of a complete circuit. To ensure reliability in use, the ICs require prior burning in to test their durability. The ICs are operated at high temperature for an extended period of time to accelerate potential failure points. This helps eliminate early product failures once the ICs are sold and/or assembled onto electronic end products. A burn-in socket assembly is used to receive an IC therein, and electrically connects the IC with a burn-in board for operation of the IC at high temperature. Normally, a temperature sensor with a digital output is mounted near the IC to measure the temperature of the assembly. The digital output is connected with a controller. The sensor provides signals to the controller through the digital output. The controller can control the temperature of the assembly in light of the signals from the sensor, thereby avoiding damage of the IC by exorbitant temperature. Pertinent example of the burn-in socket assembly is disclosed in U.S. Pat. No. 5,172,049.

Generally, a burn-in socket assembly comprises a socket, an IC mounted onto the socket and electrically connected with a number of electrical terminals of the socket, a cap mounted on a top side of the socket and having a generally rectangular first window in a middle portion thereof, and a heat sink mounted on a top surface of the IC and in the first window of the cap. A heater is mounted in the cap to heat the assembly. A sensor is mounted in the cap over the heater to measure the temperature of the assembly. The sensor has a wire connected with and providing signals to a controller. The controller can control the temperature of the assembly in light of the signals from the sensor, thereby avoiding damage of the IC by exorbitant temperature.

However, in the above-mentioned burn-in socket assembly, the sensor is mounted on the cap away from the IC. The temperature measured by the sensor is liable to be higher than the actual temperature of the IC. The IC is operated under a temperature which is lower than a desired temperature. Therefore, all early product failures are unlikely to be eliminated before sall and/or assembled onto electronics end products.

In the view of the above, a new assembly that overcomes the above-mentioned disadvantages is desired.

SUMMARY OF THE INVENTION

An object of the invention is to provide a burn-in socket assembly having an improved base, wherein the base is configured so as to hold a sensor adjacent the IC thereby reliably controlling the IC in a desired temperature.

To achieve the above-mentioned object, a burn-in socket assembly in accordance with a preferred embodiment is provided. The burn-in socket assembly comprises an insulative base receiving an IC in a middle thereof, a plurality of electrical contacts accommodated in the base, a slider member mounted onto the base and capable of moving along the base, a pair of actuation members assembled onto the base, and a cover assembled onto the actuation members and capable of moving up and down. The base forms a pair of receiving elements at front and end sides respectively. Each of the receiving elements comprises a body portion, and a pair of spaced top portion extending upwardly from the body portion. Each top portion has a slit extending through a middle portion thereof, the slit for providing flexibility for the top portion. A circular aperture is defined through the receiving element. When the burn-in socket assembly and the IC can be operated at high temperature for an extended period of time to accelerate potential failure points, a sensor, which has a wire connected with and providing signals to a controller, is assembled in the aperture of one of the receiving elements and near the IC. The controller can control the temperature of the whole assembly in light of the signals from the sensor, thereby avoiding damage of the IC by exorbitant temperature.

Other objects, advantages or novel features of the invention will become more apparent from the following detailed description when taken in adjunction with the accompanying drawings, in which:

DETAILED DESCRIPTION OF THE PREFERRED EMBODIMENT OF THE INVENTION

Reference will now be made to the drawings to describe the present invention in detail.

Figure 1:
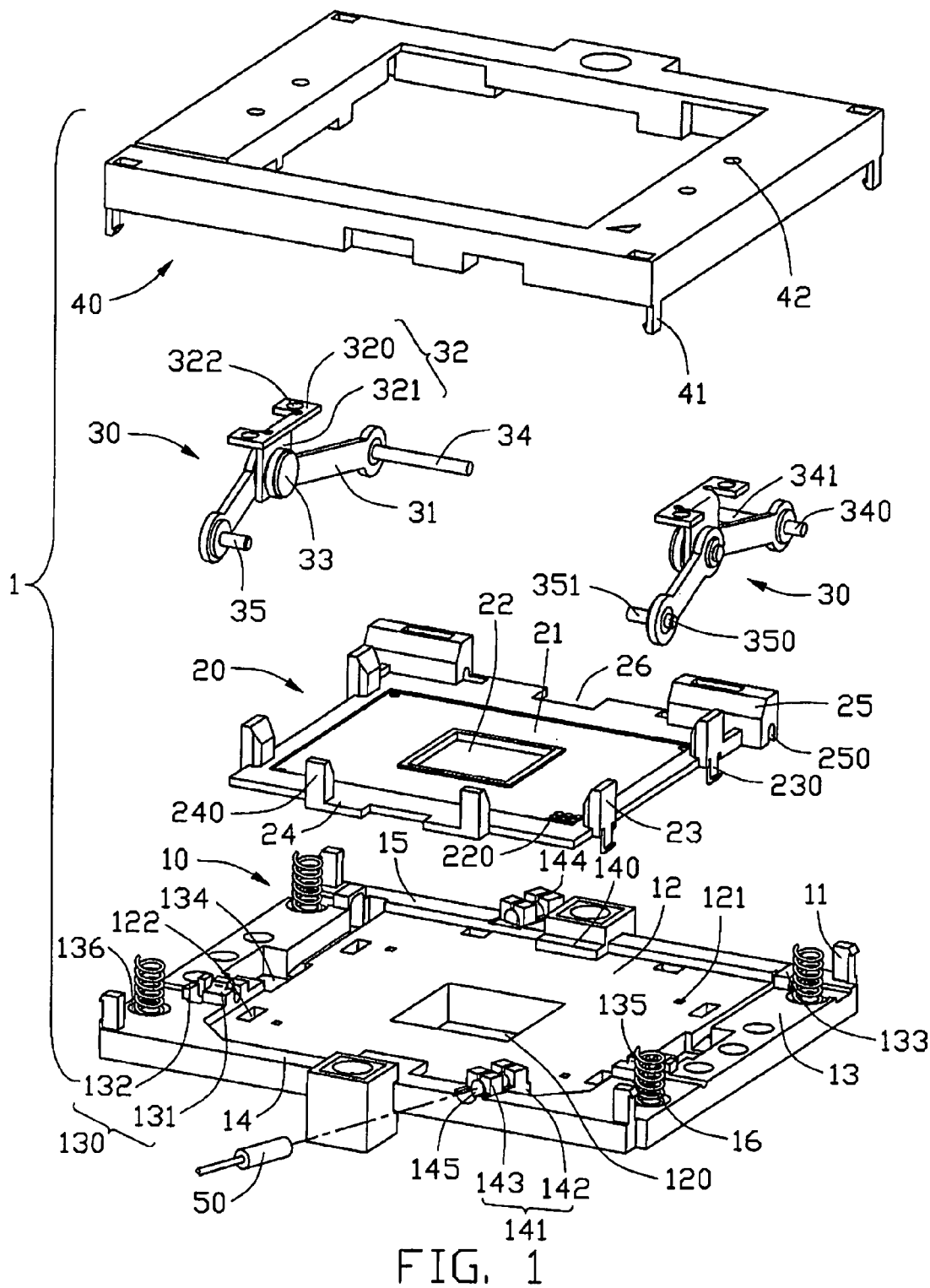
FIG. 1 is an exploded, isometric view of a burn-in socket assembly in accordance with the preferred embodiment of the present invention, wherein the burn-in socket assembly comprises a base, a slider member, a pair of actuate members and a cover.

Referring to FIG. 1, there is shown an isometric, exploded view of a burn-in socket assembly 1 of the invention. The burn-in socket assembly 1 comprises an insulative base 10, a multiplicity of electrical contacts (not shown) each having an arm, a slider member 20, a pair of actuation members 30 and a cover 40.

The base 10 is mounted on a circuit substrate such as a burn-in board (not shown), the base 10 being a generally rectangular configuration. Four latches 11 extend upwardly from four corners of the base 10 respectively. Four first holes 136 are defined in the corners of the base 10 respectively, the first holes 136 adjacent the latches 11. Four coil springs 16 are assembled onto the base 10, with ends of the springs 16 in the first holes 136 respectively. A generally rectangular cavity 12 is defined in a middle portion of the base 10. A generally rectangular first window 120 is defined in a middle of a portion of the base 10 under the first cavity 12. A multiplicity of passageways 121 is defined in the portion of the base 10 under the first cavity 12, the passageways 121 arranged around the first window 120. The contacts are received in the passageways 121 respectively. A pair of elongate slots 122 is defined in each side of the portion of the base 10 under the first cavity 12.

Each lateral side 13 of the base 10 has a first holding element 130 and a second holding element 133, and defines a recess 134 between the first holding element 130 and the second holding element 133. The first holding element 130 is disposed at a front of the lateral side 13 of the base 10, and comprises a first U-shaped portion 131, and a second U-shaped portion 132 spaced from the first U-shaped portion 131. A block 135 is formed on a top of the first U-shaped portion 131. The second holding element 133 is a ⊓-shaped configuration, and disposed at a end of the lateral side 13 of the base 10. The recess 134 is generally rectangular and near the first holding element 130.

Each of front and end sides 14, 15 of the base 10 has a step 140 at a middle portion thereof and a receiving element 141. The step 140 is generally rectangular and extends into the first cavity 12. The receiving element 141 formed on the front side 14 of the base 10 extends from the front side 14 into the first cavity 12. The receiving element 141 formed on the end side 15 extends outwards from the end side 15 of the base 10. Each receiving element 141 comprises a body portion 142, and a pair of spaced top portion 143 extending upwardly from the body portion 142. A circular aperture 145 is defined through the receiving element 141 for accommodating a sensor 50 therein. Each top portion 143 defines a slit 144 extending through middle portion thereof to facilitate assembling the sensor 50 into the aperture 145.

The slider member 20 is generally rectangular, and smaller than the first cavity 12 of the base 10. A second cavity 21 is defined in a middle portion of the slider member 20. A second window 22 is defined in a middle of a portion of the slider member 20 under the second cavity 21. A multiplicity of passages 220 is defined in the portion of the slider member 20 under the second cavity 21, the passages 220 corresponding to the passageways 121 of the base 10. Arms of the contacts are inserted into the passages 220 respectively. A pair of spaced protrusions 23 is formed on each of lateral sides of the slider member 20. Each protrusion 23 extends upwardly from the slider member 20, and has a tail 230 extending downwardly from a bottom end of the protrusion 23. The tail 230 has a clasp at an end thereof. A tongue 24 extends from a middle portion of front side of the slider member 20. A pair of spaced projecting portions 240 extends upwardly from two opposite sides of the tongue 24. A pair of standing portions 25 is formed on two opposite sides of end side of the slider member 20 respectively. Each standing portion 25 has a chamber 250 extending therethrough. A pair of openings 26 is defined in a middle of the tongue 24 and a middle portion of the end side of the slider member 20 respectively, the openings 26 corresponding to the steps 140 of the base 10.

Each of the actuation members 30 comprises a pair of connecting elements 31 and a supporting element 32. The supporting element 32 comprises a supporting portion 320 and a tab 321 extending perpendicularly from the supporting portion 320. A pair of first bores 322 is defined in two sides of the supporting portion 320. One connecting element 31 defines a groove (not shown) in an end thereof, and the other connecting element 31 defines a bore (now shown) in an end thereof. A bolt 33 is inserted through the groove and the bore so as to pivotally connect the tab 320 with ends of two the connecting elements 31, with the bolt 33 being located at an end of the groove. A spindle 34 is disposed in an opposite end of one connecting element 31, the spindle 34 having a short portion 340 and a long portion 341. A pin 35 is disposed in an opposite end of the other connecting element 31, the pin 35 having a short portion 350 and a long portion 351.

The cover 40 is a generally frame configuration, having four catches 41 extending downwardly from four corners thereof respectively. The catches 41 are disposed in accordance with the latches 11 of the base 10. Four second holes (not shown) are defined in the four corners of the cover 40, the second holes adjacent the catches 41. A pair of spaced second bores 42 is defined in a middle portion of each of lateral sides of the cover 40, the second bores 42 corresponding to the first bores 322 of the actuation members 30.

Figure 2:
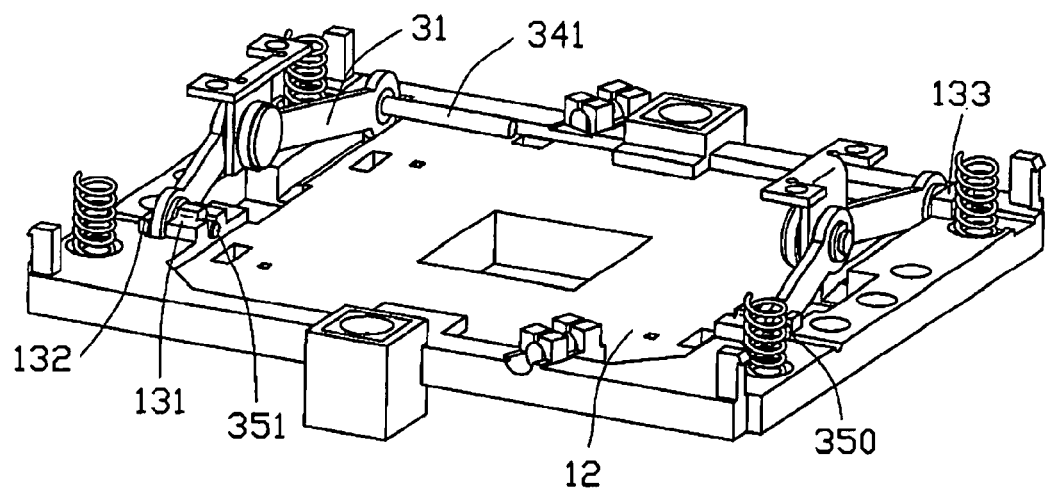
FIG. 2 is an assembled, isometric view of the base and the actuate members of FIG. 1.

Referring to FIG. 2, in assembly, the actuation members 30 are first assembled onto the base 10. Each of the connecting elements 31 with the pins 35 is mounted to the first holding element 130, with the end thereof engaging in the located in a space between the first and second U-shaped portion 131, 132 of the base 10, the long portion 351 of the pin 35 engaging in the first U-shaped portion 131 and the short portion 350 of the pin 35 engaging in the second U-shaped portion 132. Each of the connecting elements 31 with the spindles 34 is mounted to the second holding element 133, with the end thereof abutting against a surface of the second holding element 133, a short portion 340 of the spindle 34 slidablly received in a hollow of the second holding element 133, and the long portion 341 of the spindle 34 extending above the cavity 12 of the base 10.

Figure 3:
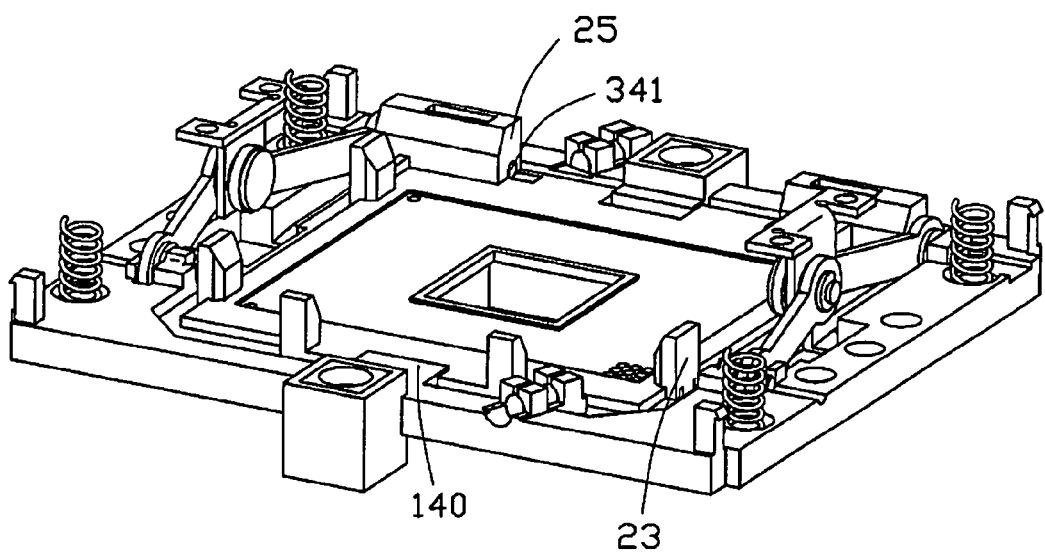
FIG. 3 is an assembled, isometric view of the base, the actuate members and the slider member of FIG. 1.

Referring to FIG. 3, secondly, the slider member 20 is mounted onto the base 10 with the tail 230 of each of the protrusions 23 received in corresponding slot 122 of the base 10 and abutting against a bottom of the base 10, and the long portions 341 of the spindles 34 received in chambers 250 of the standing portions 25 of the slider member 20 respectively. The steps 140 of the base 10 are received in the openings 26 of the slider member 20 respectively.

Figure 4:
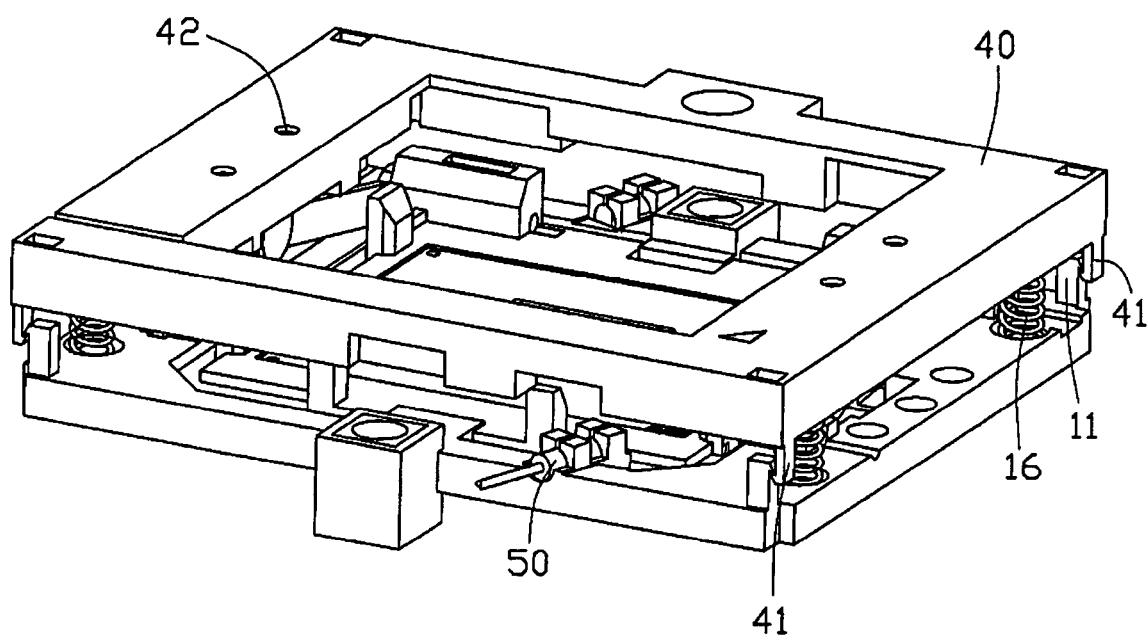
FIG. 4 is an assembled view of the burn-in socket assembly of FIG. 1.

Referring to FIG. 4, then, the cover 40 is mounted onto the actuation members 30 by four bolts (not shown) passing through the first and second bores 322, 42 to engage in four nuts (not shown) respectively, with the opposite ends of the springs 16 received in the second holes of the cover 40. The springs 16 are all in a free state. Finally, the sensor 50 is inserted into the aperture 145 one of the receiving elements 141 of the base 10.

In use, the cover 40 is pushed down to drive the supporting element 32 down, with the springs 16 being compressed and the bolts 33 moving along the grooves to opposite ends of the grooves. The connecting elements 31 with the spindles 34 go forward, because the ends of the connecting element 31 with the pins 35 are fixed onto the base 10. The long portions 341 of the spindles 34 drive the slider member 20, and the slider member 20 deforms the arms of the contacts. When the catches 41 of the cover 40 snap the latches 11 of the base 10 respectively, an IC (not shown) can be assembled onto a top of the slider member 20, with leads of the IC inserted into passages 220 of the slider member 20 respectively. The protrusions 23, projecting portions 240 and standing portions 25 of the slider member 20 position the IC. When the catches 41 are detached from the latches 11, the springs 16 are released. The cover 40 goes upwardly to an original position thereof under compression of the springs 16. The connecting element 31 with the spindle 34 goes backward. The slider member 20 goes towards an original position thereof. The arms of the contacts deflect towards original positions thereof, and reliably electrically contact the leads of the IC which is near the sensor. In this position, the burn-in socket assembly 1 and the IC can be operated at high temperature for an extended period of time to accelerate potential failure points. During operation, the sensor 50 has a wire connected with and providing signals to a controller (not shown). The controller can control the temperature of the whole assembly in light of the signals from the sensor 50, thereby avoiding damage of the IC by exorbitant temperature. After burn-in, the above-mentioned actions are repeated, and a new IC (not shown) can be assembled in the burn-in socket assembly 1 to be operated.

From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed is:

1. A burn-in socket assembly comprising:
   an insulative base defined a plurality of passageways in a middle portion thereof;
   a slider member mounted onto the base and capable of moving relative to the base, the slider member defining a plurality of holes corresponding to the passageways of the base;
   a pair of actuation members assembled on two sides of the base;
   a cover assembled on the actuation members and capable of moving from one position to another position;
   at least one spring assembled between the base and the cover, and
   wherein the base forms a receiving element on one side thereof for receiving a sensor.

2. The burn-in socket assembly as claimed in claim 1, wherein the receiving element comprises a body portion, a pair of spaced top portions extending upwardly form the body portion and an aperture defined therethrough.

3. The burn-in socket assembly as claimed in claim 2, wherein each of the top portions defines a slit extending through a middle portion thereof to facilitate assembling the sensor into the aperture.

4. The burn-in socket assembly as claimed in claim 1 wherein there are four springs each having ends received in the base and opposite ends abutting against a bottom of the cover.

5. A burn-in socket assembly comprising:
   an insulative base;
   a slider member retainably mounted onto the base and capable of moving relative to the base along a horizontal direction;
   a cover to located above the base and capable of moving from one position to another position relative to the base in a vertical direction perpendicular to said horizontal direction;
   at least one spring assembled between the base and the cover to urge said base and said cover away from each other in said vertical direction; and
   at least one actuation member linked between said cover and said base with thereof opposite upper and lower end sections pivotally connected to said cover and said base, respectively; wherein
   said lower end section actuates the slider member to move in said horizontal direction when said cover is move along said vertical direction.

6. A burn-in socket assembly comprising:
   an insulative base defined a plurality of passageways in a middle portion thereof;
   a cover disposed on the base and capable of moving from one position to another position;
   at least one receiving element formed on one side of one of the base and the cover, said at least one receiving element defining an aperture extending therethrough; and
   a sensor accommodated in the aperture to provide signals to a controller during being operated at a high temperature.

7. The burn-in socket assembly as claimed in claim 6, further comprising:
   at least one spring assembled between the base and the cover to urge said base and said the cover away from each other in said vertical direction; and
   at least one actuation member linked between said cover and said base with thereof opposite upper and lower end sections pivotally connected to said cover and said base, respectively; wherein
   said lower end section actuates the slider member to move in said horizontal direction when said cover is move along said vertical direction.

\* \* \* \* \*